United States Patent [19]

Miyamoto et al.

[11] Patent Number: 4,899,314
[45] Date of Patent: Feb. 6, 1990

[54] SEMICONDUCTOR MEMORY

[75] Inventors: Kazuhisa Miyamoto; Shuuichi Miyaoka, both of Ohme; Masanori Odaka, Kodaira, all of Japan

[73] Assignee: Hitachi, Ltd., Tokyo, Japan

[21] Appl. No.: 184,661

[22] Filed: Apr. 21, 1988

[30] Foreign Application Priority Data

Apr. 24, 1987 [JP] Japan .................................. 62-99775

[51] Int. Cl.⁴ ........................................... G11C 11/34
[52] U.S. Cl. .................................. 365/226; 307/296.6
[58] Field of Search ........................... 307/296 R, 297; 365/226, 227

[56] References Cited

U.S. PATENT DOCUMENTS 4,433,390 2/1984 Carp et al. ...................... 365/226 X

FOREIGN PATENT DOCUMENTS 58-60487 4/1983 Japan .

Primary Examiner—Joseph A. Popek
Attorney, Agent, or Firm—Antonelli, Terry & Wands

[57] ABSTRACT

A semiconductor integrated circuit is provided having first and second level generate circuits producing different levels and first and second emitter follower circuits respectively connected thereto. A level generated by one of the first and second level generate circuits is selectively supplied to either one of the first and second emitter follower circuits. This enables the first and second emitter follower circuits to supply the respective circuits formed in a semiconductor substrate with stable reference voltages.

7 Claims, 5 Drawing Sheets

SEMICONDUCTOR MEMORY

BACKGROUND OF THE INVENTION

The present invention relates to a semiconductor memory in a technology effectively applied, for example, to a bipolar-type random access memory (RAM) comprising emitter coupled logic (ECL) circuits or a bipolar complementary MOS (CMOS) RAM including bipolar transistors, p-channel MOSFETs, and n-channel MOSFETs.

There has been commonly used a bipolar RAM constituted with ECL circuits. The RAMs of the bipolar type are classified into two types including a so-called 10K type with the source voltage set to $-5.2$ V and a so-called 100K type with the source voltage set to $-4.5$ V.

The bipolar RAM has been described, for example, in the Japanese Patent Laid-Open No. 58-60487.

Input circuits and logic gate circuits constituting a peripheral circuit system of such RAM of the bipolar type includes as a basic configuration a current switch circuit having a differential transistor. These logic gate circuits have logic threshold levels each set by a reference potential $-Vbb$ supplied to a base of the differential transistor.

In order to establish the reference potential $-Vbb$, the RAM of the bipolar type includes a 10K-type constant voltage generate circuit including a level generate circuit VG3 and an emitter follower output circuit VO3 and a 100K-type constant voltage generate circuit VG4 including a level generate circuit VO4 and an emitter follower output circuit VO4. These constant voltage generate circuits are alternatively set to be effective through a master slice operation depending on the power supply voltage supplied to the bipolar-type RAM. The constant voltage generate circuits VG3 and VG4 are respectively formed, for example, at the ends of a semiconductor substrate SUB as shown in FIG. 4 and one of the constant voltage generate circuits set to be effective supplies the reference voltage $-Vbb$ to all circuits in the semiconductor substrate SUB. Consequently, since the reference potential $-Vbb$ is supplied from the constant voltage generate circuit to the respective current switch circuits and the length of each lines used to supply the reference potential is increased, the reference potential $-Vbb$ is accordingly decreased due to the wiring resistance of the lines and the like. As a result, the logical threshold levels of the input circuits and logic gate circuits are changed and hence the operation of the RAM of the bipolar type becomes unstable.

On the other hand, the reference potential $-Vbb$ generated by the constant voltage generate circuit VG3 or VG4 is supplied to a plurality of current switch circuits, namely, the reference voltage $-Vbb$ is supplied to bases of a relatively large number of transistors. Consequently, when the states of a plurality of current switch circuits vary at the same time, there appears a substantial change at the same time in each base current of the plural transistors to which the reference potential $-Vbb$ is supplied. As a result, the reference potential $-Vbb$ is changed. To prevent this adverse phenomenon, as shown in FIG. 7, there are added to the constant voltage generate circuit capacitors C5-C6 or C7-C8 each having a relatively large electrostatic capacity. This enables the variation in the reference level to be effectively suppressed. However, when this method is employed, for each of the two constant voltage generate circuits VG3 and VG4 integrated in the RAM of the bipolar type, the capacitors C5-C6 and C7-C8 each occupying a relatively large area are respectively required to be disposed. Consequently, the layout efficiency of the semiconductor substrate is reduced and the chip size is hence increased.

SUMMARY OF THE INVENTION

It is therefore an object of the present invention to provide a semiconductor memory in which the variation in the reference potential is prevented so as to stabilize the operation thereof.

The object above and other objects as well as the new features of the present invention will be apparent from the detailed description taken in conjunction with the accompanying drawings.

At both ends of a semiconductor substrate, there are respectively arranged level generate circuits and emitter follower output circuits constituting the 10K-type and 100K-type constant voltage generate circuits, reference level input terminals of these two emitter follower output circuits are commonly connected, and the two emitter follower output circuits are linked to one of the level generate circuits depending on a power source voltage supplied thereto. Each of the emitter follower output circuits supplies a reference potential to peripheral circuits disposed in the proximity thereof.

According to the means above, the lines to supply the reference potential can be of a relatively short length, which enables the reduction of the reference potential and the like due to the wiring resistance and which further enables the operation of the semiconductor memory such as RAM of the bipolar type to be stabilized.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Figure 2:
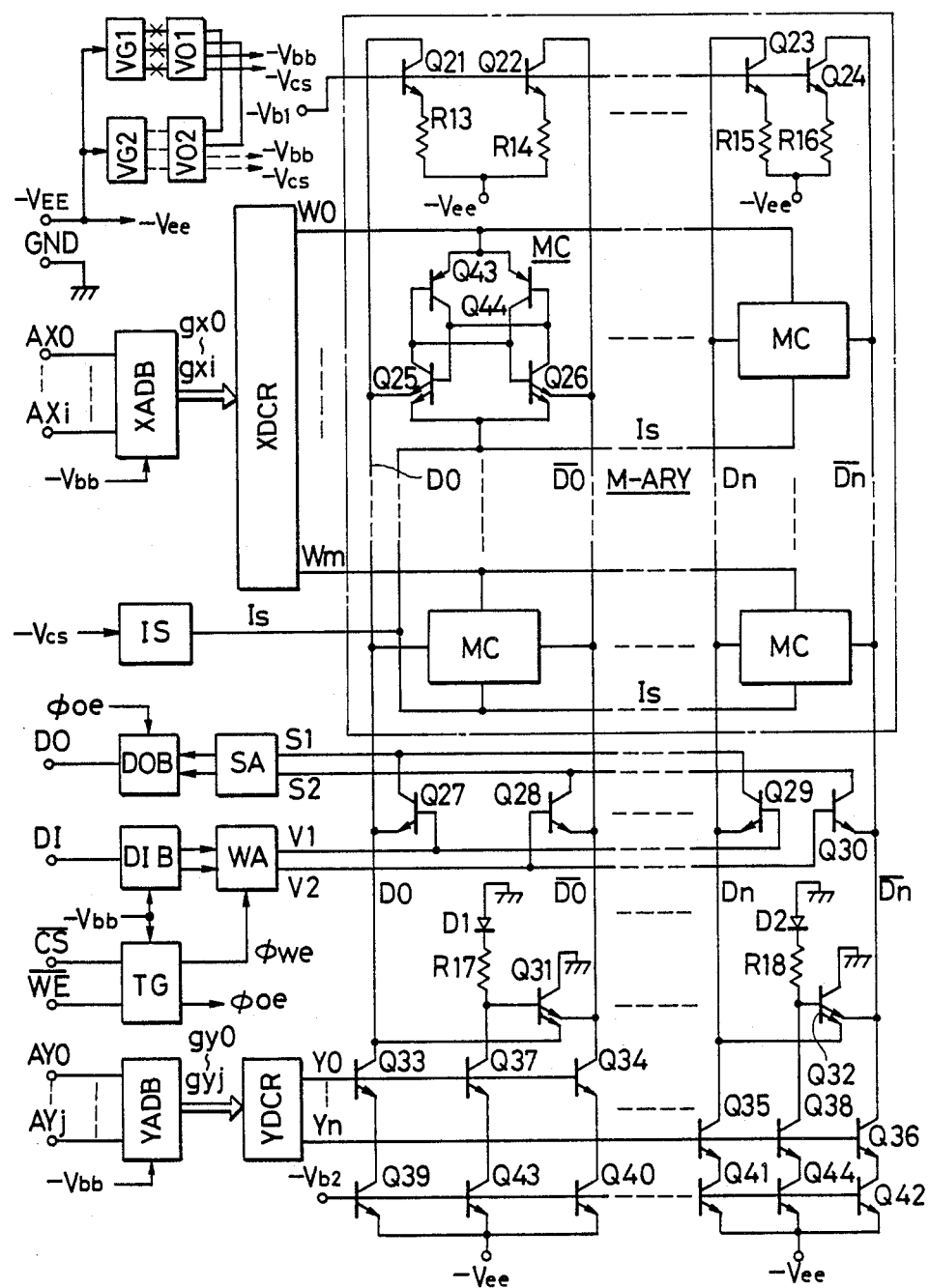
FIG. 2 is a schematic block diagram illustrating an embodiment of a RAM of the bipolar type including level generate circuits and the emitter follower circuits in accordance with the present invention.

FIG. 2 shows a circuit block diagram of an embodiment of RAM of the bipolar type to which the present invention is applied. The RAM of this figure is formed on a semiconductor substrate such as a silicon substrate according to the known technology for manufacturing a semiconductor integrated circuit.

The RAM of the bipolar type of this embodiment includes an ECL circuit as the basic structure thereof such that the operation of the RAM can be effected by changing over between the devices respectively of the 10K and 100K types respectively using −5.2 V and −4.5 V as the power source voltages. The change-over operation can be achieved by the master slice method, although the invention is not limited to this. The RAM of the bipolar type includes two sets of level generate circuits VG1 and VG2 and emitter follower output circuits VO1 and VO2 respectively arranged on the sides of the semiconductor substrate, namely, on a side of the semiconductor substrate and on a side opposing thereto. These level generate circuits and emitter follower output circuits are selectively combined into an operative state depending on the power source voltage supplied thereto so as to function as a 10K-type or 100K-type constant voltage generate circuit. Although not particularly limited thereto, in order to simplify the following description, this embodiment shows a case where the bipolar-type RAM is used as a 10K-type device; consequently, the reference potential −Vbb and the reference potential −Vcs are generated by the 10K-type constant voltage generate circuit including the level generate circuit VG1 and the emitter follower output circuits VO1 and VO2 so as to be supplied to the respective circuits.

In FIG. 2, a memory array M-ARY includes (m+1) word lines W0-Wm disposed in the horizontal direction in the figure, (n+1) sets of complementary data lines D0·$\overline{D0}$ to Dn·$\overline{Dn}$, and (m+1)X(n+1) memory cells MCs arranged in a lattice structure at the intersections between the word lines and the complementary data lines.

Each memory cell MC is, not particularly limited to, constituted with a flip-flop circuit including, for example as shown as an instatiation thereof in FIG. 2, driving transistors Q25-Q26 of the npn type having bases and collectors connected crosswise thereto and load transistors Q43-Q44 of the pnp type respectively arranged on the collectors of the driving transistors. The driving transistors Q25-Q26 of the memory cell MC respectively are, not particularly limited to, of the multiemitter structure and have two emitters. One of the emitters of each transistor is commonly connected and is further linked to a hold current supply line Is which will be described later. The other emitters of the driving transistors Q25-Q26 are used as input/output terminals of the memory cell and are respectively connected to a noninverse signal line and an inverse signal line of the complementary data line (bit line or digit line) D0·$\overline{D0}$. The emitters of the load transistors Q43-Q44 constituting the memory cell MC are commonly connected and are further linked to the corresponding word line W0.

Similarly, the input/output terminals of the m+1 memory cells MCs disposed in the same column of the memory array M-ARY are respectively linked in a common fashion to the non-inverse signal lines or inverse signal lines of the corresponding complementary data lines D0·$\overline{D0}$-Dn·$\overline{Dn}$. Furthermore, the commonly connected emitters of the load transistors associated with the m+1 memory cells MCs disposed in the same row of the memory array M-ARY are respectively linked in a common fashion to the corresponding word lines W0-Wm. The emitters commonly connected of the driving transistors Q25-Q26 of all memory cells MCs are linked to the hold current supply line Is and is then further linked to the hold current supply circuit IS.

The hold current supply circuit IS receives, although not limited to, a reference potential −Vcs from the constant voltage generate circuit VG1 or VG2 so as to develop a function to flow a predetermined storage holding or keeping current to the memory cells MCs. Since the memory hold current is also supplied when a bipolar-type RAM is set to the non-selection state, the value thereof is set to a relatively small value such that the pertinent memory cell MC can keep the data stored therein.

The word lines W0-Wm constituting the memory array M-ARY are linked to an X address decoder XDCR. Of these word lines, a word line specified by X address signals AX0-AXi is alternatively set to a high level indicating a selection state, and the remaining word lines are set to a low level associated with the non-selection state.

External X address signals AX0-AXi supplied from an external device (not shown) are delivered via external terminals AX0-AXi to an X address buffer XADB. The X address buffer XADB generates, based on these external X address signals AX0-AXi, complementary internal address signals ax0-axi and supplies the generated signals to the X address decoder XDCR. (In this specification, for example, an internal address signal ax0 having the same phase as that of an external address signal AX0 and an internal addres signal $\overline{ax0}$ having the opposite phase as that of the external address signal AX0 are collectively represented as a complementary internal address signal ax0. This applies also to other internal address signals.)

The X address decoder XDCR decodes the complementary internal address signals ax0-axi supplied from the X address buffer XADB and then sets a corresponding word line to a high level indicating the selection state.

On the other hand, the complementary data lines D0·$\overline{D0}$ to Dn·$\overline{Dn}$ constituting the memory array M-ARY are, as representatively shown by the complementary data lines D0·$\overline{D0}$ to Dn·$\overline{Dn}$ of FIG. 2, linked via the corresponding column switching transistors Q33-Q34 or Q35-Q36 to the associated transistors Q39-Q40 or Q41-Q42, respectively. The emitters of these transistors Q39-Q40 or Q41-Q42 are linked to the power source voltage −Vee of the circuit, whereas the bases thereof are supplied with a predetermined bias voltage −Vb2. This causes the transistors Q39-Q40 to Q41-Q42 to function as a constant voltage source for the write and read operations.

The bases of the column switching transistors Q33-Q34 and Q35-Q36 are respectively supplied with the corresponding data line select signals Y0-Yn from a Y address decoder YDCR which will be described later in this specification. These data line select signals are ordinarily set to a low level denoting a non-selection state. When the external Y address signals AY0-AYj are arranged in a combination indicating a desired complementary data line, a data line select signal corresponding to the desired complementary data line is alternatively set to a high level designating a selection state, and the remaining data line select signals are set to the low level denoting the nonselection state.

The external Y addreess signals AY0-AYj supplied from an external device are fed to the Y address buffer YADB via the external terminals AY0-AYj. The Y address buffer YADB generates, based on these Y address signals AYO-AYj, complementary internal address signals ayO-ayj, which are then delivered to the Y address decoder YDCR.

The Y address decoder YDCR decodes the complementary internal address signals ayO-ayj supplied from the Y address buffer YADB and then alternatively sets one of the data line select signals YO-Yn to a high level indicating the selection state corresponding thereto. This causes a pair of column switching transistors Q33-Q34 andd Q35-Q36 designated by the external Y address signals AYO-AYj to be selectively set to the on state.

In this embodiment, although not limited to, in order to apply a predetermined bias voltage to complementary data lines to be set to the non-selection state, there is included the following bias circuit. That is, the complementary data lines DO·$\overline{DO}$ to Dn·$\overline{Dn}$ are on one side thereof linked via the corresponding transistors Q21-Q22 and Q23-Q24 and the resistors R13-R14 and R15-R16 to the power source voltage $-$Vee (represented as $-V_{EE}$ in some cases in this specification) of the circuit. The gates of the transistors Q21-Q22 and Q23-Q24 are commonly connected and are supplied with a predetermined bias voltage $-$Vb1 generated by another constant voltage generate circuit (not shown). This causes the transistors Q21-Q22 and Q23-Q24 and the transistors R12-R14 and R15-R16 to respectively function as constant current sources so as to effect the operation to draw a small current for the corresponding complementary data lines DO·$\overline{DO}$ to Dn·$\overline{Dn}$ in any cases.

On the other hand, the complementary data lines DO·$\overline{DO}$ to Dn·$\overline{Dn}$ are on the other side linked to the first and second emitters of the corresponding npn transistors Q31-Q32. The collectors of these transistors Q31-Q32 are linked to the ground potential (to be represented as Vss1 or Vss2 herebelow in some cases) of the circuit, and there are respectively disposed a diode D1 and a resistor R17 or a diode D2 and a resistor R18 each in a serial form between the bases thereof and the collectors, namely, the ground potential of the circuit. Moreover, the bases of the transistors Q31-Q32 are respectively linked to the collectors of the transistors Q43-Q44 via the column switching transistors Q37-Q38 disposed in a parallel fashion with respect to the column switching transistors Q33-Q34 and Q35-Q36. The emitters of these transistors Q43-Q44 are linked to the power source voltage $-$Vee of the circuit and the bases thereof are supplied with the bias voltage $-$Vb2, hereby implementing the function of a constant current source.

When the complementary data lines are set to the non-selection state, the column switching transistors Q37-Q38 corresponding to the complementary data lines are set to the off state. Consequently, the potential values of the non-inverse and inverse signal lines of the respective complementary data lines are biased substantially with voltage attained by adding the forward-directional voltage of the diodes D1-D2 to the base-emitter voltage of the transistors Q31-Q32. On the other hand, when the complementry data lines are set to the selection state, an alternative selection is effected on the column switching transistors Q37-Q38 to be set to the on state corresponding to one the complementary data lines to be set to the selection state. Consequently, the registers R17-R18 are supplied with a relatively large current from the transistors Q37-Q38 via the transistors Q43-Q44 corresponding to the complementary data lines to be set to the selection state. As a result, the transistors Q31-Q32 turn off and hence a pair of complementary data lines to be selected are set to a potential level corresponding to information stored in a memory cell selected. In this situation, the other column switching transistors Q33-Q34 and Q35-Q36 corresponding to the complementary data lines to be selected are selectively set to the on state, and the complementary data lines DO·$\overline{DO}$ to Dn·$\overline{Dn}$ are supplied with a relatively large current via the corresponding transistors Q39-Q40 and Q41-A42. Furthermore, the n +1 memory cells MCs linked with the selected word lines are supplied with a relatively large operating current since the corresponding word lines are set to the high level. As a result, the respective levels of the non-inverse and inverse signal lines of the selected complementary data lines are increased such that the difference between the levels becomes greater.

Moreover, on the complementary data lines DO·$\overline{DO}$ to Dn·$\overline{Dn}$, as shown as an instantiation in FIG. 2, there are respectively disposed current change-over switching transistors Q27-Q28 and Q29-Q30 of which the emitters are linked to the non-inverse or inverse signal line of the corresponding complementary data lines. The collectors of these current change-over switching transistors Q27-Q28 and Q29-Q30 are linked to the complementary signal lines S1-S2 and are further linked to an input terminal of a sense amplifier SA. In addition, the bases of these current change-over switching transistors Q27-Q28 and Q29-Q30 are linked to the complementary signal lines V1-V2 and are further linked to an output terminal of a write amplifier WA. The levels of the complementary signal lines V1-V2 are, when the bipolar-type RAM is set to the read operation mode, set to substantially an intermediate potential of a read signal level of the complementary data lines according to the data stored in the selected memory cell MC, and the level is used as the reference potential for a read operation. In this operation, the transistors Q27-Q28 and Q29-Q30 are driven in a differential manner together with the driving transistors Q25-Q26 and the like of the corresponding memory cell MC, and there is attained via the complementary signal lines S1-S2 in the sense amplifier SA a read current corresponding to the data stored in the selected memory cell. On the other hand, when the bipolar-type RAM is set to the write operation mode, the transistors Q27-Q28 and Q29-Q30 are driven in a differential manner together with the driving transistors Q25-Q26 and the like of the corresponding memory cell MC like in the case of the write operation mode. Moreover, in this situation, the complementary signal lines V1-V2 are complementarily set to be higher than the high level indicating the storage hold voltage or to be lower than the low level thereof of the memory cell set to the selection state depending on the write data supplied from the data input terminal DI via the data input buffer DIB. This causes the driving transistors of the selected memory cell to be complementarily set to the on or off state according to the levels of the complementary signal lines V1-V2, and hence the storage data is replaced or is rewritten with write data supplied from an external device.

The sense amplifier SA amplifies a read signal transmitted via the complementary signal lines S1-S2 and effects a level conversion on the read signal, which is thereafter sent to the data output buffer DOB. The data output buffer DOB is, in the read operation mode of the bipolar-type ram, selectively set to the operating state according to a timing signal φoe supplied from a timing generate circuit TG and sends the read signal outputted from the sense amplifier SA via an open-collector output transistor to the data output terminal DO.

The data input buffer DIB receives write data supplied from an external device via the data input terminal DI and accomplishes a level conversion on the write data, which is transmitted as a complementary write signal to the write amplifier. The write amplifier WA sets, in the write operation mode of the bipolar-type RAM, the complementary signal lines V1-V2 to the levels according to the write signal supplied from the data in put buffer DIB in synchronism with the timing signal φwe supplied from the timing generate circuit TG. Furthermore, when the bipolar-type RAM is in the read mode, the write amplifier WA sets the levels of the complementary signal lines V1-V2 to an intermediate level to be used as the read reference level.

The timing generate circuit TG generates the timing signals φwe and φoe from the chip select signal CS and the write enable signal $\overline{WE}$ supplied as control signals from an external device and supplies the generated signals to the write amplifier WA and the data output buffer DO.

For the X address buffer XADB, Y address buffer YADB, data input buffer DIB, and timing generate circuit TG, there are disposed input and logic gate circuits each including as the basic configuration a current switch circuit constituted with differential transistors. Consequently, the respective circuits are supplied with a reference potential −Vbb to be employed to establish the logic threshold level of the current switch circuit. The reference potential −Vbb and the reference potential −Vcs above are generated by one of the constant voltage generate circuits of the 10K ane 100K type including the level generate circuits VG1-VG2 and the emitter follower output circuits VO1-VO2 which are selectively combined into an operative state according to the power source voltage supplied to the bipolar-type RAM.

The bipolar-type RAM of this embodiment is provided with two sets of the level generate circuits VG1 and VG2 and the emitter follower output circuits VO1 and VO2, which will be described later in this specification. Of these circuits, the level generate circuit VG1 and the emitter follower output circuit VO1 are disposed at an end of the semiconductor substrate in which the bipolar-type RAM is to be formed; whereas the level generate circuit VG2 and the emitter follower output circuit VO2 are disposed at the other end of the semiconductor substrate. These level generate circuits and the emitter follower output circuits are selectively combined into an operating state according to the power source voltage supplied from the bipolar-type RAM, thereby functioning as a 10K-type or 100K-type constant voltage generate circuit.

A concrete circuit configuration of these level generate circuits VG1-VG2 and the emitter follower output circuits VO1-V002 and operations of the 10K-type and 100K-type constant voltage generate circuits constituted with these level generate circuits and emitter follower output circuits will be later described in detail.

Figure 1:
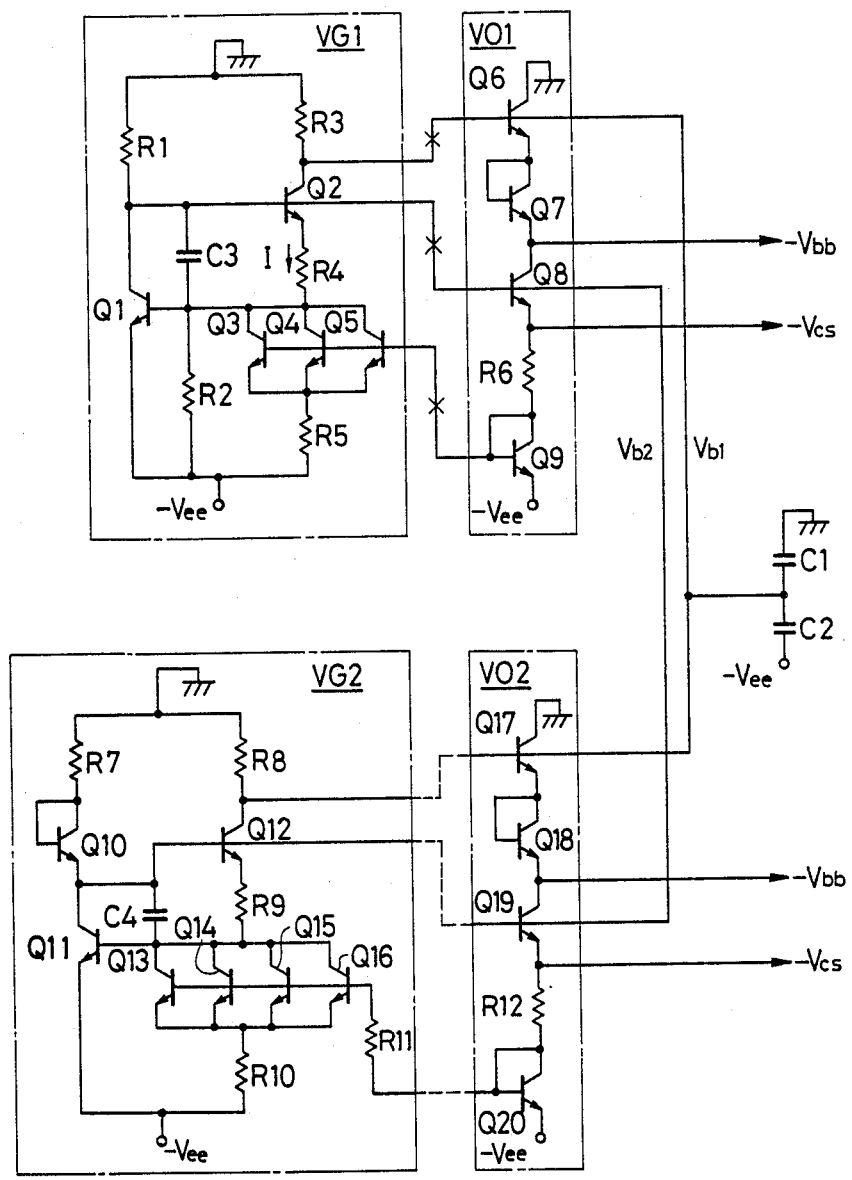
FIG. 1 is a circuit diagram schematically showing an embodiment of level generate circuits and emitter follower output circuits to which the present invention is applied.

FIG. 1 shows a circuit diagram of an embodiment including the level generate circuits VG1-VG2 and the emitter follower output circuits VO1-VO2 of FIG. 2. As described above, the bipolar-type RAM of this embodiment is provided with two sets of level generate circuits VG1 and VG2 and emitter follower output circuits VO1 and VO2 so as to be selectively combined into an operative state according to the power source voltage supplied from the bipolar-type RAM. As a result, the 10K-type or 100K-type constant voltage generate circuit is configured.

In FIG. 1, the level generate circuit VG1 includes npn-type bipolar transistors Q1-Q5, resistors R1-R5, and a capacitor C3. The emitter of the transistor Q1 is linked to the power source voltage −Vee, and there is disposed a register R1 between the collector of the transistor Q1 and the ground potential of the circuit. Furthermore, the base of the transistor Q1 is linked to the commonly connected collectors of the transistors Q3-Q5 arranged in a parallel connection. A capacitor C3 preventing an oscillation is disposed between the base and the collector of the transistor Q1, whereas there is disposed a resistor R2 between the base of the transistor Q1 and the power source voltage −Vee. Between the commonly connected collectors of the parallel transistors Q3-Q5 and the ground potential of the circuit, there are arranged a resistor R3, a transistor Q2, and a resistor R4 each connected in series. Furthermore, a resistor R5 is disposed between the commonly connected emitters of the parallel transistors Q3-Q5 and the power source voltage −Vee. The collector voltage of the transistor Q2 is supplied as the first reference level to the base of the transistor 6 of the emitter follower output circuit VO1. The base of the transistor Q2 is linked to the collector of the transistor Q1. The base voltage of the transistor Q2 is supplied as the second reference level to the base of the transistor Q8 of the emitter follower output circuit VO1. The commonly connected bases of the parallel transistors Q3-Q5 are supplied with the collector and base voltages of the transistor Q9 of the emitter follower output circuit VO1. Three wirings disposed between the bases of the transistors Q6, Q8, and Q9 and the collector and the base of the transistor Q2 and the commonly connected bases of the parallel transistors Q3-Q5, respectively are selectively formed according to the master slice operation, which will be described later in this specification. Furthermore, the transistor Q2 of the level generate circuit VG1 and the transistor Q8 of the emitter follower output circuit VO1 are designed to possess the same forward-directional voltage between the base and the emitter.

Similarly, that the level generate circuit VG2 includes npn-type bipolar transistors Q10-Q16, resistors R7-R11, and a capacitor C4. The emitter of the transistor Q11 is linked to the lower source voltage −Vee, and there is disposed a register R1 and a transistor Q10 for a level shift between the collector of the transistor Q11 and the ground potential of the circuit. The collector and the base of the transistor Q10 are commonly connected, thereby implementing the diode configuration. The base of the transistor Q11 is linked to the commonly connected collectors of the transistors Q13-Q16 arranged in a parallel connection. A capacitor C4 preventing an oscillation is disposed between the base and the collector of the transistor Q11. Between the commonly connected collectors of the parallel transistors Q13-Q16 and the ground potential of the circuit, there are arranged a resistor R8, a transistor Q12, and a resistor R9 each connected in series. Furthermore, a resistor R10 is disposed between the commonly connected emitters of the parallel transistors Q13-Q16 and the power source voltage −Vee. The collector voltage of the transistor Q12 is supplied as the first reference level to the base of the transistor Q17 of the emitter follower output circuit VO2. The base of the transistor Q12 is linked to the collector of the transistor Q11. The base voltage of the transistor Q12 is supplied as the second reference level to the base of the transistor Q19 of the emitter follower output circuit VO2. The commonly connected bases of the parallel transistors Q13-Q16 are supplied with the collector and base voltages of the transistor Q20 of the emitter follower output circuit VO2. Three wirings disposed between the bases of the transistors Q17, Q19, and Q20 and the collector and the base of the transistor Q12 and the commonly connected bases of the parallel transistors Q13-Q16, respectively are selectively formed according to the master slice operation like in the case of the emitter follower output circuit VO1 above. Furthermore, the transistor Q12 of the level generate circuit VG2 and the transistor Q19 of the emitter follower output circuit VO2 are designed to possess the same forwarddirectional voltage between the base and the emitter.

The emitter follower output circuit VO1 includes transistors Q6-Q9 disposed in a series connection between the ground potential of the circuit and the power source voltage −Vee. Of these transistors, the collectors and the bases of the transistors Q7 and Q9 are commonly connected and hence the transistors are configured in a diode structure. The collector voltage and the emitter voltage of the transistor Q8 are supplied respectively as the reference potential −Vbb and the reference potential −Vcs to a plurality of circuits disposed in the proximity of the emitter follower output circuit VO1.

Similarly, the emitter follower output circuit VO2 includes transistors Q17-Q20 disposed in a series connection between the ground potential of the circuit and the power source voltage −Vee. Of these transistors, the collectors and the bases of the transistors Q18 and Q20 are commonly connected and hence the transistors are configured in a diode structure. The collector voltage and the emitter voltage of the transistor Q19 are supplied respectively as the reference potential −Vbb and the reference potential −Vcs to a plurality of circuits disposed in the proximity of the emitter follower output circuit VO1. In these emitter follower output circuits VO1 and VO2, the respectively corresponding circuit elements are designed to possess the same electric characteristics.

The base of the transistor Q6 of the emitter follower output circuit VO1 is fixedly linked via a link wiring Vb1 to the base of the transistor Q17 of the emitter follower output circuit VO2. Between the link wiring Vb1 and the ground potential of the circuit, there is disposed a capacitor C1 which prevents the level variation and which has a relatively large electrostatic capacity. Moreover, between the link wiring Vb1 and the power source voltage −Vee, there is disposed capacitor C2 which prevents the level variation and which has a relatively large electrostatic capacity. On the other hand, the base of the transistor Q8 of the emitter follower output circuit VO1 is fixedly linked via a link wiring Vb2 to the base of the transistor Q19 of the emitter follower output circuit VO2. As described above, between the commonly connected bases of the transistors Q6 and Q17, namely, the link wiring Vb1 and the collector of the transistor Q2 of the level generate circuit VG1 or the transistor Q12 of the level generate circuit VG2, there is arranged a link wiring alternatively formed according to the master slice method. Similarly, between the commonly connected bases of the transistors Q8 and Q19, namely, the link wiring Vb2 and the collector of the transistor Q2 of the level generate circuit VG1 or the transistor Q12 of the level generate circuit VG2, there is arranged a link wiring alternatively formed accordingly to the master slice method. Furthermore, between the base of the transistor Q9 of the emitter follower output circuit VO1 and the commonly connected bases of the parallel transistors Q3-Q5 of the level generate circuit VG1 or between the base of the transistor Q20 of the emitter follower output circuit VO2 and the commonly connected bases (substantially, the resistor R11) of the parallel transistors Q13-Q16, there is arranged a link wiring alternatively formed according to the master slice method.

Although not limited to, the power source voltage −Vee supplied to the bipolar-type RAM of this embodiment is assumed to be -5.2 V. Consequently, the link wirings indicated by solid lines are disposed between the level generate circuit VG1 and the emitter follower output circuits VO1-VO2. This causes the level generate circuit VG1 and the emitter follower output circuits VO1-VO2 to function as a 10K-type constant voltage generate circuit. In a case where the power source voltage −Vee supplied to the bipolar type RAM is set to -4.5 V, the link wirings disposed between the level generate circuit VG1 and the emitter follower output circuits VO1-VO2 are disconnected at the points of X, and in place thereof, link wirings indicated with dotted lines are disposed between the level generate circuit VG2 and the emitter follower output circuits VO1-VO2. In this situation, the level generate circuit VG2 and the emitter follower output circuits VO1-VO2 function as a 100K-type constant voltage generate circuit.

In FIG. 1, assuming that a total of current I flows through the resistors R3-R5, the transistor Q2, and the parallel transistors Q3-Q5 of the level generate circuit VG1, the emitter voltage of the transistor Q8 of the emitter follower output circuit VO1 and that of the transistor Q19 of the emitter follower circuit VO2, namely, the reference potential −Vcs of the 10K-type constant voltage generate circuit is represented as follows.

$$-V_{cs} = -V_{ee} + (V_{BE1} + I \cdot R4 + V_{BE2} - V_{BE8}) \quad (1)$$
$$= -V_{ee} + I \cdot R4 + V_{BE1}$$

where, $V_{Be1}$, $V_{BE2}$, and $V_{BE8}$ stands for the forward-directional voltages between the base and the emitter of the transistors Q1, Q2, and Q8, respectively. Similarly, in the following description, the forward-directional voltage between the base and the emitter of the pertinent transistor is represented by adding a numeric value after $V_{BE}$.

In addition, assuming the forward-directional voltage between the base and the emitter of the prallel transistors Q3-Q5 to be $V_{BE3}$, the following relation is attained.

$$V_{BE9} = V_{BE3} + I \cdot R5$$

This leads to $$I = (V_{BE9} - V_{BE3})/R5 \quad (2)$$

Substituting the expression (2) into the expression (1) above, $$-V_{CS} = -V_{ee} + V_{BE\,1} + (V_{BE\,9} - V_{BE\,3})R4/R5 \quad (3)$$

results. The reference voltage $-V_{cs}$ is supplied to the bases of the driving transistors functioning as the constant current sources of the differential transistors constituting the current switch circuits in the respective circuits of the bipolar-type RAM. The emitters of these driving transistors are linked via the emitter resistance to the power source voltage $-V_{ee}$ of the circuit. Consequently, the emitter current of the driving transistors, namely, the operating current $I_E$ supplied to the differential transistors of the respective current switch circuits is represented as follows when the base-emitter voltage of the driving transistor is $V_{BE}$ and the resistance value of the emitter resistance is $R_E$.

$$\begin{aligned} I_E &= \{-V_{cs} - V_{BE} - (-V_{ee})\}/R_E \\ &= (-V_{cs} - V_{BE} + V_{ee})/R_5 \\ &= \{V_{BE\,1} - V_{BE} + \\ &\quad (V_{BE\,9} - V_{BE\,3})R\,4/R\,5\}/R_E \end{aligned}$$

The operating current $I_E$ does not include the influence of the power source voltage $-V_{ee}$ and is hence a stable constant current, and the current value thereof can be arbitrarily set depending on the ratio between the resistance values R4 and R5.

On the other hand, as represented by the expression (2) above, since the current I takes a stable current value independent of the power source voltage $-V_{ee}$, the absolute value Vbb of the reference potential $-V_{bb}$ is attained as follows.

$$\begin{aligned} Vbb &= V_{BE\,6} + V_{BE\,7} + I \cdot R\,3 \quad (4) \\ &= V_{BE\,6} + V_{BE\,7} + \\ &\quad (V_{BE\,9} - V_{BE\,3})R\,3/R\,5 \end{aligned}$$

Similarly, since the expression (4) does not include the term associated with the power source voltage $-V_{ee}$, the reference potential $-V_{bb}$ becomes a stable voltage not having dependence on the power source voltage. Furthermore, a desired voltage value of the reference potential, $-V_{bb}$ can be developed by appropriately setting the ratio between the resistance values of R3 and R5.

As described above, the bases of the transistors Q6 and Q8 of the emitter follower output circuit VO1 and the bases of the transistors Q17 and Q19 of the emitter follower output circuit VO2 are respectively linked via the link wirings Vb1 and Vb2 so as to respectively have the same reference level. The current supplied to these link wirings includes only a relatively small base current to the corresponding transistors and the circuit elements constituting the emitter follower output circuits VO1 and VO2 are designed to have substantially the same electric charcteristics. As a result, although the emitter follower output circuits VO1 and VO2 are located on the sides of the semiconductor substrate and are accordingly apart from each other, the reference potential $-V_{bb}$ and the reference potential $-V_{cs}$ attained respectively as the collector voltage and the emitter voltage of the transistor Q19 of the emitter follower output circuit VO2 take substantially the same voltage values as those of the reference potential $-V_{bb}$ and the reference potential $-V_{cs}$ generated by the emitter follower output circuit VO1. Moreover, as described above, since the link wiring Vb1 is provided with the capacitors C1 and C2 to prevent the level change, the voltage value of the reference potential $-V_{bb}$ is further stabilized.

Incidentally, in a case where the bipolar-type RAM is of the 100K type, as described above, the link wirings indicated as X and disposed between the level generator VG1 and the emitter follower output circuit VO1 are disconnected, and in place thereof, the link wirings indicated with dotted lines are formed between the level generate circuit VG2 and the emitter follower output circuit VO2. In other words, the bases of the transistors Q6 and Q8 of the emitter follower output circuit VO1 and those the transistors Q17 and Q19 of the emitter follower output circuit VO2 are respectively supplied with the first and second reference levels generated by the level generate circuit VG2. Consequently, the reference potential $-V_{cs}$ produced from the emitter follower output circuits VO1 and VO2 is, like in the case of the 10K-type constant voltage generate circuit, represented as follows.

$$-V_{CS} = -V_{ee} + V_{BE\,11} + (V_{BE\,20} - V_{BE\,13})\,R9/R10$$

where, $V_{BE13}$ indicates the forward-directional voltage between the base and the emitter of the parallel transistors Q13-Q16. Namely, the operating current of each current switch circuit produced according to the reference potential $-V_{cs}$ becomes to be a stable constant current without having dependence on the power source voltage, and the current value thereof can be arbitrarily set according to the ratio between the resistance values R9 and R10.

Similarly, the absolute value Vbb of the reference potential $-V_{bb}$ is obtained as follows.

$$Vbb = V_{BE\,17} + V_{BE\,18} + (V_{BE\,20} - V_{SE\,13})\,R8/R10$$

That is, the reference potential $-V_{bb}$ also becomes to be a stable constant voltage not having dependence on the power source voltage, and the voltage value thereof can be arbitrarily set according to the ratio between the resistance values R8 and R10.

Figure 3:
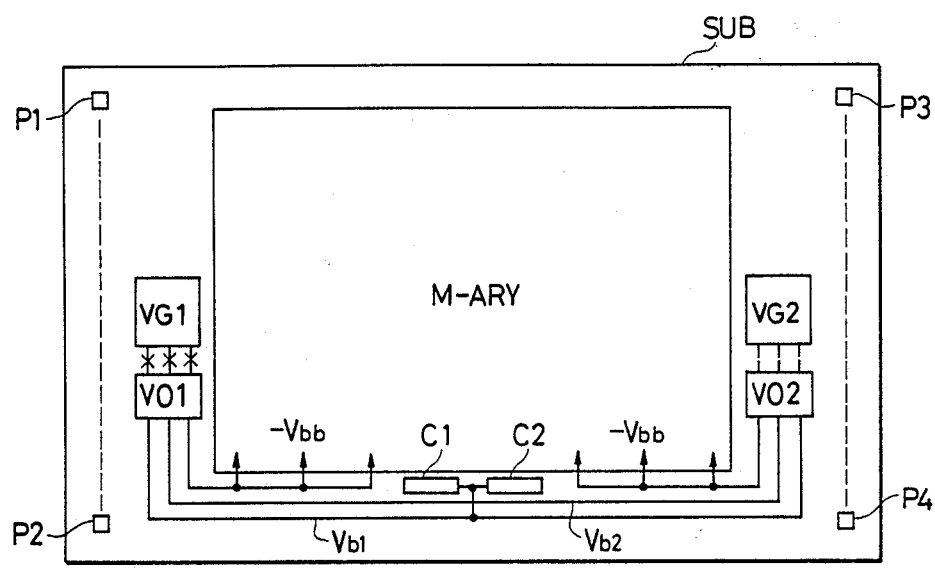
FIG. 3 is a schematic diagram showing a layout of an example of the RAM of the bipolar type of FIG. 2.
Figure 4:
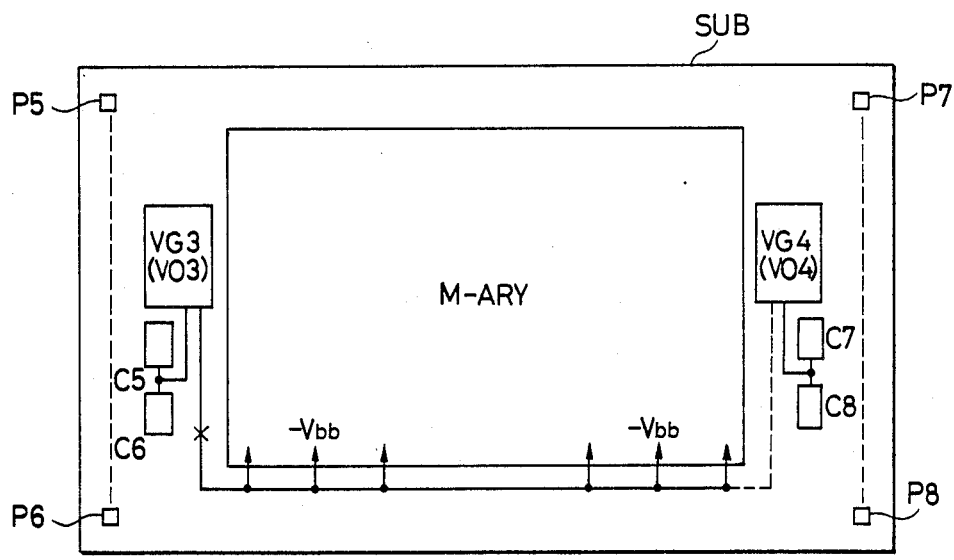
FIG. 4 is a schematic diagram showing a layout of an example of the conventional RAM of the bipolar type.

FIG. 3 shows a schematic diagram showing an arrangement of an embodiment of the bipolar-type RAM according to the embodiment above. This configuration includes the level generate circuits VG1-VG2, the emitter follower output circuits VO1-VO2, and the memory array M-ARY and peripheral circuits thereof other than the emitter follower output circuits VO1-VO2 shown as a unit of the M-ARY.

In FIG. 3, the bipolar-type RAM is formed on a semiconductor substrate SUB. On both ends of the semiconductor substrate SUB, there are respectively formed bonding pads P1-P2 and P3-P4 each arranged in a line, and at the central part thereof, the memory array M-ARY and the peripheral circuits thereof are formed. On the ends of the semiconductor substrate SUB, there are formed the level generate circuit VG1 and the emitter follower output circuit VO1 in the neighborhood of the bonding pads P1-P2, and the level generate circuit VG2 and the emitter follower output circuit VO2 are disposed in the neighborhood of the bonding pads P3-P4. At substantially the central part in the lower portion of the semiconductor substrate SUB, the capacitors C1 and C2 are formed to prevent the level fluctuation, and the link wirings Vb1 and Vb2 are disposed in the vicinity thereof.

Between the level generate circuit VG1 and the emitter follower output circuit VO1, there is arranged three link wirings to be selectively formed in the master slice method according to the power source voltage supplied thereto. Furthermore, in the similar fashion, between the level generate circuit VG2 and the emitter follower output circuit VO2, there are arranged three link wirings to be selectively formed in the master slice method according to the power source voltage supplied thereto. Although not limited to, since the bipolar-type RAM of this embodiment is of the 10K type, the link wirings are established between the level generate circuit VG1 and the emitter follower output circuit VO1, whereas such link wirings are not formed between the level generate circuit VG2 and the emitter follower output circuit VO2. When the bipolar-type RAM is set as a 100K-type device, the link wirings between the level generate circuit VG1 and the emitter follower output circuit VO1 are disconnected at locations marked with X, whereas the link wirings indicated with dotted lines are established between the level generate circuit VG2 and the emitter follower output circuit VO2.

The reference potential $-V_{bb}$ produced by the emitter follower output circuit VO1 is supplied to the memory array M-ARY and the peripheral circuits associated therewith arranged in the neighborhood of the emitter follower output circuit VO1. Furthermore, the reference potential $-V_{bb}$ produced by the emitter follower output circuit VO2 is supplied to the memory array M-ARY and the peripheral circuits associated therewith arranged in the neighborhood of the emitter follower output circuit VO2.

As described above, in the bipolar-type RAM of this embodiment, the level generate circuit VG1 and the emitter follower output circuit VO1 as well as the level generate circuit VG2 and the emitter follower output circuit VO2 constituting the 10K-type and 100K-type constant voltage generate circuits, respectively are disposed on both ends of the semiconductor substrate. The reference level input terminals of the emitter follower output circuits VO1-VO2 are respectively linked in a fixed manner such that the capacitors C1 and C2 preventing the level fluctuation are disposed at substantially intermediate points thereof. The emitter follower output circuits VO1-VO2 are selectively linked to the level generate circuit VG1 or VG2 according to the power source voltage supplied to the RAM of the bipolar type such that reference level is supplied to generate the reference potential $-V_{bb}$. The reference potential $-V_{bb}$ is respectively delivered from the emitter follower output circuits VO1 and VO2 to the memory array M-ARY and the peripheral circuits arranged in the proximity of the respective emitter follower output circuits. Consequently, the lengths of the wirings disposed to supply the reference potential $-V_{bb}$ from the emitter follower output circuits VO1-VO2 can be minimized, which prevents the reduction of the reference potential $-V_{bb}$ due to the wiring resistance, and the like. In addition, since the capacitor preventing the level fluctuation and occupying a relatively large area is shared between the level generate circuits VG1-VG2 and hence only one capacitor is required, the layout efficiency of the semiconductor substrate is increased and the chip size is reduced.

Figure 5:
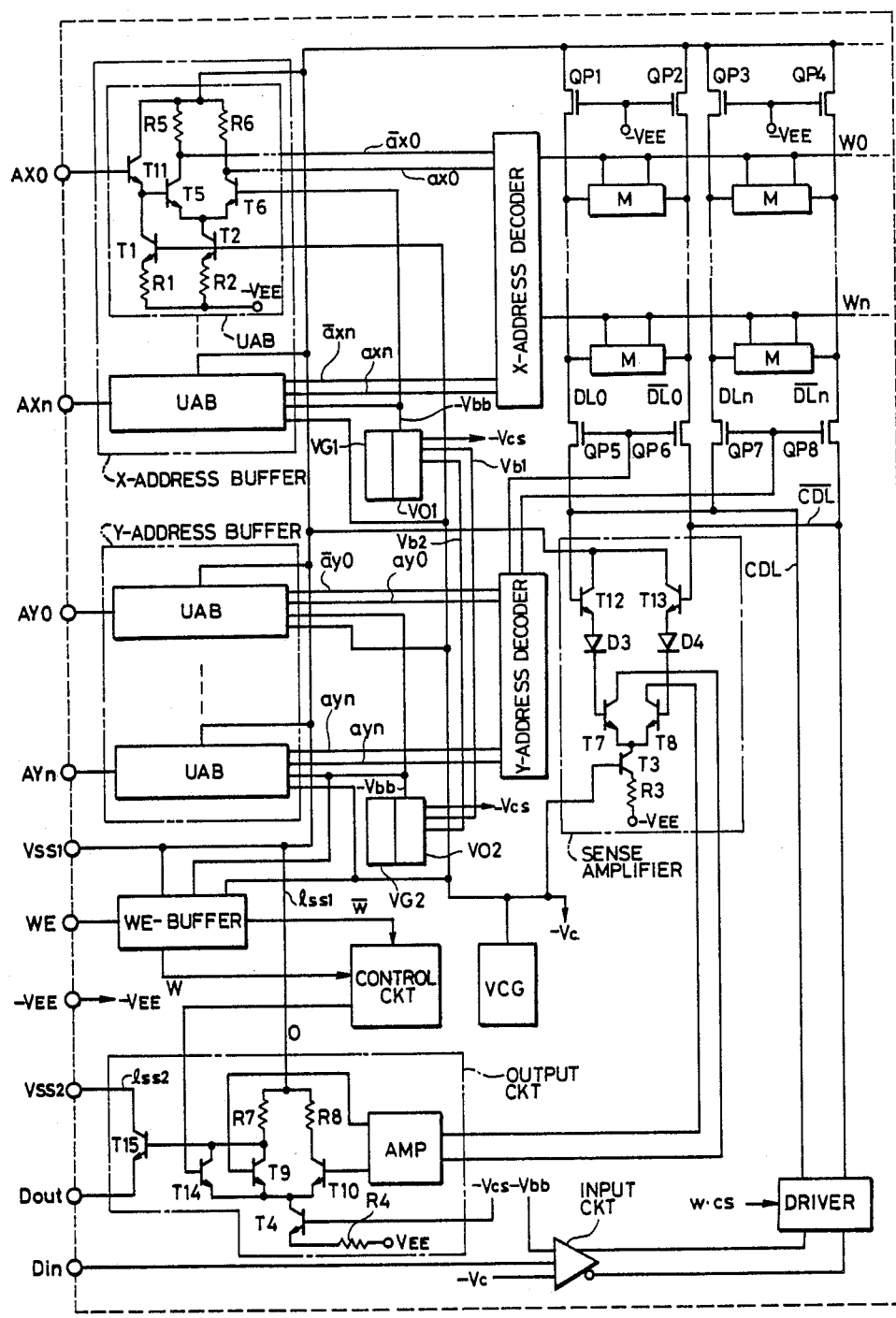
FIG. 5 is a circuit block diagram schematically showing an embodiment of a RAM of the bipolar CMOS type to which the present invention is applied.
Figure 6:
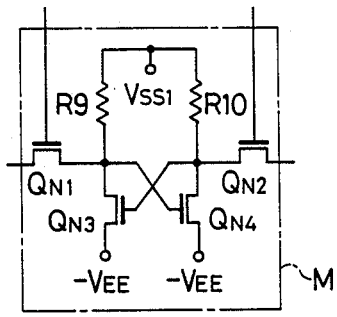
FIG. 6 is a schematic circuit diagram showing a memory cell employed in the RAM of the bipolar CMOS type of FIG. 5.
Figure 7:
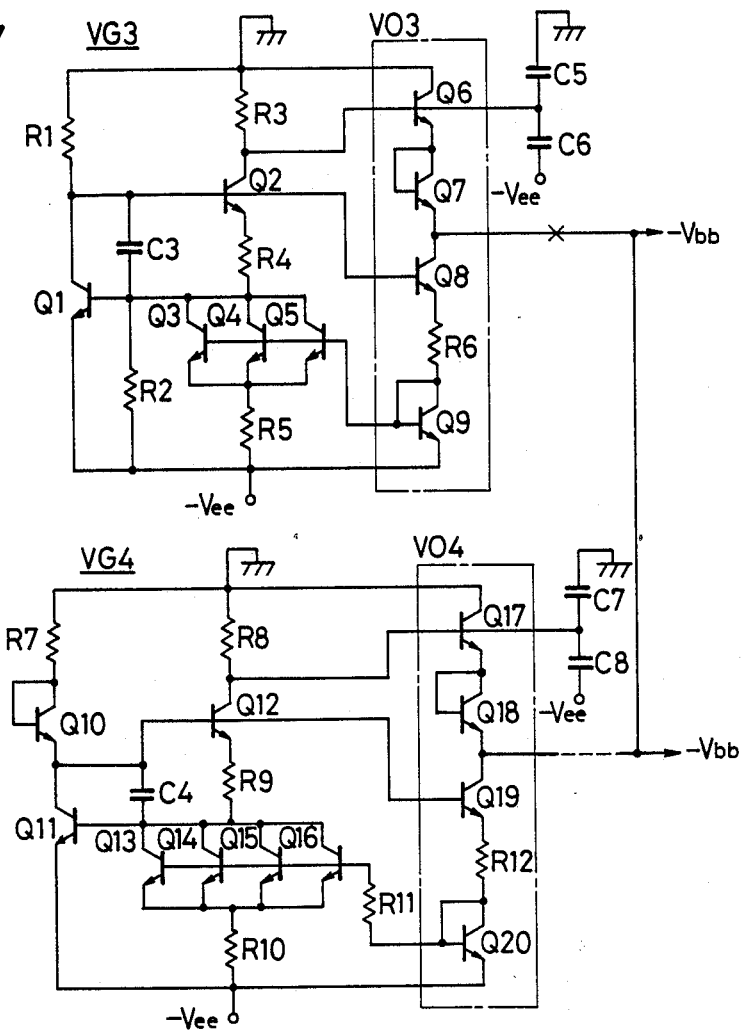
FIG. 7 is a circuit diagram schematically showing an example of the level generate circuits and emitter follower circuits of the conventional RAM of the bipolar type.

FIG. 5 shows the primary circuits of the static-type RAM of an embodiment according to the present invention.

In this configuration, the circuits enclosed with broken lines are formed on a semiconductor substrate by use of the known semiconductor integrated circuit technology. The static-type RAM of this embodiment is a static RAM of the bipolar CMOS type configured with bipolar transistors and CMOS circuits.

X-coordinate address signals AXO-AXn are supplied from an external device via external input terminals AXO-AXn to an X-address buffer. In the X-address buffer, complementary address signals axO, axO-axn, and axn are produced and are then supplied to an X-address decoder. The X-address decoder than decodes the complementary address signals above so as to select from a plurality of word lines WO-Wn a word line (e.g. WO) indicated by the complementary address signals. Y-coordinate address signals AYO-AYn are supplied from an external device via external input terminals AYO-AYn to a Y-address buffer. In the Y-address buffer, complementary address signals ayO, ayO-ayn, and ayn are produced through signal conversions and are then supplied to a Y-address decoder. The Y-address decoder then decodes the complementary address signals ayO, $\overline{ay0}$-ayn, and $\overline{ayn}$ above so as to supply a selection signal thus attained by the decode operation to a column switch including MOSFETs Q46-Q49. The column switch is, as shown in FIG. 5, linked between a plurality of pairs of data lines DLO-$\overline{DLO}$ to DLn-$\overline{DLn}$ and a pair of common data lines CDL-$\overline{CDL}$ and links in response to the selection signal supplied from the Y-address decoder the pairs of the common lines CDL-$\overline{CDL}$ to the pair of data lines (e.g. the pair of data lines DLO-$\overline{DLO}$) indicated by the Y-coordinate address signals AYO-ATn and selected from the plural data line pairs.

In this fashion, from the plural word lines and plural data line pairs, a word line (WO) and a pair of data lines (DLO-$\overline{DLO}$) are selected according to the address signals AXO-AXn and AYO-AYn. At intersections between the word lines and the data line pairs, there are connected memory cells MCs. The memory cell MC includes a pair of MOSFETs of the n-channel type QN3-QN4 crosswise linked to each other, resistors R9-R10, and a pair of MOSFETs of n-channel type QN1-QN2 for transmission. These memory cells MCs constitute a memory array, and when a word line and a pair of data lines are selected according to the address signals AXO-AXn and AYO-AYn as described above, a memory array linked to the selected word line and the data line pair is selected in the memory array.

Information stored in the selected memory cell MC is transmitted via the column switch to the common data line pair CDL-$\overline{CDL}$, which are linked to a sense amplifier. The sense amplifer includes bipolar-type transistors T12-T13 of which the bases are connected to the common data line pair CDL-$\overline{CDL}$ and of which the collectors are linked to a wiring lss1 associated with the ground potential of the circuit, transistors T7-T8 connected in a differential configuration, a constant current circuit Iss linked between the differential transistors T7-T8 and a negative potential node $-V_{ee}$, and diodes D3-D4 connected between the emitters of the transistors T12-T13 and the bases of the transistorsr T7-T8. A signal transmitted from the selected memory cell M via the column switch to the common data line CDL undergoes a level shift by means of the transistor T12 and the diode D3 and is then delivered to the base of the differential transistor T7. Similarly, a signal transmitted from the selected memory cell to the common data line $\overline{\text{CDL}}$ undergoes a level shift by means of the transistor T13 and the diode D4 and is then delivered to the base of the differential transistor T8. Information signals of the selected memory cell delivered to the bases of the differential transistors T7-T8 are amplified by the differential transistors so as to be transmitted to an output circuit.

The constant current circuit Iss described above includes a bipolar transistor T3 of which the collector is linked to the emitters of the differential transistors T7-T8 and a resistor R3 connected between the emitter of the bipolar transistor T3 and the power source voltage $-V_{EE}$. Although not particularly limited to, in this embodiment, there is disposed a voltage generate circuit VCG which produces a constant voltage $-Vc$ by receiving the power source voltage $-V_{EE}$ and the ground potential Vss1, and the constant voltage $-Vc$ is supplied to the base of the transistor T3. As a result, a predetermined constant current is attained by means of the bipolar transistor T3 and the resistor R3.

The output circuit includes an amplifier circuit AMP for receiving a pair of complementary output signals outputed from the sense circuit so as to amplify the received signals, a bipolar current switch circuit controlled by signals configured in a complementary fashion and outputted from the amplifier circuit AMP, and an output transistor 15 of the bipolar type which has a base for receiving the output signal from the bipolar current switch circuit, a collector linked to an external power source terminal Vss2 via the ground potential wiring lss2 of the circuit, and an emitter connected to an output external terminal Dout. The bipolar current switch circuit comprises a transistor T10 having a base receiving one of a pair of output signals produced by the amplifier circuit AMP, a transistor T9 having a base receiving the other one of the pair of output signals produced by the amplifier circuit AMP, resistors R7-R8 connected between the respective collectors of these transistors T9-T10 and the ground wiring lss1, and a constant current circuit Iso connected between the respective emitters of these transistors T9-T10 and the negative potential node $-V_{EE}$. Furthermore, the current switch circuit includes a transistor T14 having a base receiving a control signal O, the transistor T14 connected in parallel to the transistor T9 above.

In the output circuit, when the transistor T14 is turned off by the control signal O, the transistor T9 or T10 is set to the on state according to the storage information of the selected memory cell. As a result, the output transistor T15 is also set to the on or off state according to the storage information of the selected memory cell. While the output transistor T15 is kept in the on state, the external terminal Dout is supplied with a current via the output transistor T15 associated with the ground potential Vss of the circuit applied to the external terminal Vs2. As a result, the potential of the external terminal Dout becomes to be identical to the ground potential Vss. In contrast, when the output transistor T15 is kept in the off state, the potential of the external terminal Dout is set to be substantially equal to the potential of the negative potential source by use of resistor means (not shown) connected between the external terminal Dout and the negative potential source (not shown). That is, the RAM of this embodiment has an open emitter output.

The constant current circuit Iso above is configured in the similar fashion as that of the constant current circuit Iss. Namely, the constant current circuit Iso includes a bipolar transistor T4 of which the collector is connected to the emitters of the differential transistors T9-T10 and a resistor R4 connected between the emitter of the transistor T4 and the power source potential $-V_{EE}$. Although not limited to, the base of the bipolar transistor T4 for the constant current is supplied with the reference voltage $-Vcs$ produced from the emitter follower output circuit VO1 or VO2, which will be later described in this specification. As a result, the constant current circuit comprising the transistor T4 associated with the constant current and the resistor R4 generates a constant current.

The external input terminal Din is connected to an input node of the input circuit. The input circuit produces, in response to an input signal supplied to the input node, an output signal having the same phase as that of the input signal and an output signal having the opposite phase as compared with that of the input signal. The output signals respectively having the same and opposite phases are supplied to a driver, which in turn amplifies the signals. The attained signals are transmitted to the common data line pair CDL-$\overline{\text{CDL}}$. The driver amplifies the output signals described above and passes the resultant signals to the common data line pair CDL-$\overline{\text{CDL}}$ when the chip is in the selection state and is ready for a data write operation. For this purpose, the operations of the driver are controlled by a control signal W.CS. When the amplified signals respectively with the same and opposite phases are transmitted to the common data line pair CDL-$\overline{\text{CDL}}$, the memory cell selected in the write operation undergoes a write operation with information corresponding to the external input signal supplied to the input terminal Din.

The control signal W.CS is set to the low level in a read operation so as to prevent the operation of the driver, thereby avoiding a wrong write operation in the read operation.

Furthermore, although not particularly limited to, the control signal O is set to the high level in a write operation, which sets the transistor T14 to the on state and the output transistor T15 to the off state.

The control signal O is, although not limited to, produced according to a write enable signal $\overline{\text{WE}}$ applied to the external terminal $\overline{\text{WE}}$. Namely, in a write enable signal buffer $\overline{\text{WE}}$-buffer configured in the same fashion as the unit address buffer UAD which will be described later in detail, a control signal $\overline{w}$ having substantially the same phase as the write enable signal $\overline{\text{WE}}$ and a control signal w having the opposite signal as compared with that of the write enable signal $\overline{\text{WE}}$ are produced. The control signal O is generated by a control circuit receiving the control signals $\overline{w}$ and w above.

The X-address buffer includes a plurality of unit address buffers UABs and the Y-address buffer is similarly constituted with a plurality of unit address buffers UABs. Each unit address buffer UAB is, although not particularly limited to, of the similar configuration, and hence the figure shows a detailed circuit only of the unit address buffer UAB receiving the address signal Axo.

The unit address buffer UAB includes an emitter follower circuit receiving an address signal Axo supplied via an external input terminal Axo and a bipolar current switch circuit receiving the output signal from the emitter follower circuit and the reference potential $-Vbb$. The emitter follower circuit comprises a bipolar transistor T11 having a base linked to the external terminal Axo, a collector linked to the ground potential wiring lss1, and an emitter linked via a constant current circuit Isb1 to the negative node $-V_{EE}$. The current switch circuit includes a bipolar transistor 5 having a base receiving an output signal from the emitter follower circuit, a collector linked via a resistor R5 to the ground potential wiring lss1, and an emitter linked via a constant current circuit Isb2 to the negative node $-V_{EE}$ and a differential bipolar transistor T6 having a base receiving the reference voltage $-Vbb$, a collector linked via a resistor R6 to the ground potential wiring lss1, and an emitter linked to the emitter of the transistor T5. The complementary output signals Axo-$\overline{Axo}$ of the X-address buffer are produced according to signals appearing on the collectors of the transistors T5-T6.

The transistor T5 in the current switch circuit is set to the on state when the potential of the output signal from the emitter follower circuit is higher than the reference potential $-Vbb$ and is contrarily set to the off state when the potential of the output signal from the emitter follower circuit is lower than the reference potential $-Vbb$. Furthermore, the transistor T6 is set to the on state when the reference potential $-Vbb$ is higher than that of the output signal from the emitter follower circuit and is contrarily set to the off state when the reference potential $-Vbb$ is lower than the potential of the output signal from the emitter follower circuit. Consequently, on receiving a high-level address signal Axo having a potential at least equal to a predetermined potential (threshold voltage) determined by the reference potential $-Vbb$, the unit address buffer UAB produces a high-level internal address signal axO and a low-level internal address signal $\overline{axo}$. In contrast, when a low-level address signal Axo having potential lower than the predetermined potential is received, the unit address buffer UAB produces a low-level internal address signal axO and a high-level internal address signal $\overline{axo}$.

The constant current circuits Isb1-Isb2 described above are respectively configured in the similar fashion as compared with the constant current circuit Iss. Namely, the constant current circuit Isb1 includes a bipolar transistor T1 for the constant current and a resistor R1, whereas the constant current circuit Isb2 is constituted with a bipolar transistor T2 for the constant current and a resistor R2. The bases of the constant-current bipolar transistors T1-T2 are supplied with a constant voltage $-Vc$ generated by the constant voltage generate circuit VCG. This enables the constant current circuits Isb1-Isb2 to respectively produce the constant current.

In this figure, the circuits VG1-VG2 and VO1-VO2 are the level generate circuits and the emitter follower circuits, respectively of FIG. 1.

In this embodiment, although not particularly limited to, the emitter follower circuit VO1 is located in the proximity of the X-address buffer, whereas the emitter follower output circuit VO2 is arranged in the neighborhood of the Y-address buffer, the write enable signal buffer $\overline{WE}$-buffer, and the input circuit. Consequently, the reference potential $-Vbb$ applied to the base of the differential transistor T6 in the unit address buffer UAB of the X-address buffer is produced by the emitter follower output circuit VO1. In contrast, the reference potential $-Vbb$ applied to the base of the differential transistor T6 in the unit address buffer UAB of the Y-address buffer is generated by the emitter follower output circuit VO2.

The write enable signal buffer $\overline{WE}$-buffer and the input circuits are respectively configured in the similar structure as compared with the unit address buffer UAB. Consequently, the base of the differential transistor T6 of each of the write enable signal buffer $\overline{WE}$-buffer and the input circuit is supplied with the reference potential $-Vbb$ produced by the emitter follower output circuit VO2 disposed in the vicinity of these circuits. Furthermore, the bases of the constant-current transistors T1-T2 in the write enable signal buffer $\overline{WE}$-buffer and the input circuit are, although not limited to, supplied with the reference potential $-Vc$ generated by the constant voltage generate circuit VCG.

Depending on whether the RAM of the bipolar CMOS type is uses as a 10k-type or 100k-type device, the emitter follower circuits VO1 and VO2 are linked to the level generate circuits VG1 and VG2 as already described in conjunction with FIG. 1. When the RAM of the bipolar-CMOS type is operated as a 10k-type device, the output voltage produced by the level generate circuit VG1 is supplied to the emitter follower output circuit VO1 and is further delivered via the link wirings Vb1-Vb2 to the emitter follower output circuit VO2. As a result, the unit address buffers UABs, the write enable signal buffer $\overline{WE}$-buffer, and the input circuit respectively in the X-address buffer and the Y-address buffer are supplied with the reference potential $-Vbb$ having a potential and characteristics suitable for the 10k-type operation. In contrast, when the RAM of the bipolar CMOS-type is operated as a 100k-type device, the output voltage produced by the level generate circuit VG2 is supplied to the emitter follower output circuit VO2 and is further delivered via the link wirings Vb1-Vb2 to the emitter follower output circuit VO1. As a result, the unit address buffers UABs, the write enable signal buffer $\overline{WE}$-buffer, and the input circuit are supplied with the reference potential $-Vbb$ having a potential and characteristics suitable for the 100k-type operation. As a result, the logic threshold values of the address buffers UABs, the $\overline{WE}$-buffer, and the input circuit can be selectively changed.

In FIG. 5, QP1-QP4 indicate p-channel MOSFETs constituting the load of the data lines and the gates of these MOSFETs are supplied with the power source voltage $-V_{EE}$. Furthermore, the MOSFETs QP5-QP8 constituting the column switch are MOSFETs of the p-channel type, and hence the Y-address decoder generates a low-level ($-V_{EE}$) select signal for the complementary data lines to be selected and produces a high-level (Vss1) select signal for the complementary data lines not to be selected.

In this figure, although only a portion is shown, the ground potential wiring lss1 is linked to the circuits other than the output transistor T15 so as to supply the ground potential to these circuits. Furthermore, the circuits are linked to the negative potential terminal $-V_{EE}$ to receive the potential $-V12_E$. In this embodiment, although not particularly limited to, the output transistor T1 is supplied with the voltage Vss via the wiring lss2. Consequently, even when a noise takes place during an operation of the output transistor T15, the effect of the noise can be prevented from propagating to the other circuits.

Although not shown in this figure, the link wiring Vb1 is linked to capacitors like the capacitors C1 and C2 of FIG. 1 so as to reduce the level fluctuation.

The respective circuits constituting the RAM of the bipolar-CMOS type of FIG. 5 are, like in the case of the bipolar-type RAM of FIG. 2, arranged as shown in FIG. 3. Namely, in this embodiment, the unit address buffers UABs constituting the X-address buffer are disposed in the proximity of the emitter follower output circuit VO1 and are linked to the external terminals via the bonding pads P1 and P2. The unit address buffers UABs, the write enable signal buffer $\overline{WE}$-buffer, and the input circuit constituting the Y-address buffer are disposed in the proximity of the emitter follower output circuit VO2 and are linked to the external terminals via the bonding pads P3 and P4.

Furthermore, although the concrete configurations of the X-address buffer, the Y-address buffer, and the like are not shown in FIG. 5, the configurations thereof have been disclosed, for example, in the U.S. Patent Application Ser. No. 701,226 filed on Feb. 13, 1985.

As demonstrated by the embodiments above, when the present invention is applied to a semiconductor memory devices such as a bipolar-type RAM and an RAM of the bipolar-CMOS type of which the specification can be changed between of the 10K type or 100K type depending on the power source voltage, the following effects are attained.

(1) The level generate circuits and the emitter follower output circuits respectively constituting the 10K-type and 100K-type constant voltage generate circuits are formed respectively on both sides of the semiconductor substrate, the reference level input terminals of the two emitter follower output circuits are fixedly linked to each other and are further linked to one of the level generate circuits depending on the power source voltage, and the reference potential and the like are supplied to the memory array M-ARY and peripheral circuits arranged in the vicinity of the two emitter follower output circuits from the respective emitter follower output circuits located on the respective sides of the semiconductor substrate, which leads to an effect that the wiring length of the supply lines is minimized and hence the reduction of the reference potential and the like due to the wiring resistance can be prevented.

(2) Based on the effect (1) above, the logical threshold levels of the input circuits and logic gate circuits can be stabilized, thereby leading to an effect that the operations of the semiconductor memory devices such as a bipolar-type RAM and an RAM of the bipolar-CMOS type can be stabilized.

(3) In association with (1) above, when the capacitor preventing the level fluctuation is shared and is arranged substantially at an intermediate position among the two level generate circuits and the emitter follower output circuits, there can be attained effects that the layout efficiency of the semiconductor substrate is increased and that the increase in the chip size can be accordingly prevented.

The present invention of the inventor has been concretely described with reference to the embodiments; however, the present invention is not restricted by the embodiments above. The embodiments can be naturally modified in various fashions without departing from the scope and spirit of the present invention. For example, in the arrangement diagram of FIG. 3, the capacitors C1 and C2 may be located in the neighborhood of one of the emitter follower output circuits VO1 and VO2, or two capacitors may be disposed corresponding to the respective level generate circuits. Furthermore, the level generate circuits VG1 and VG2 and the emitter follower output circuits VO1 and VO2 may also be arranged in locations other than those shown in FIG. 3. In the embodiment of FIG. 2, the memory cells of the bipolar-type RAM may be configured such that a high resistance is disposed for the load transistor of the pnp type in the parallel fashion or that a resistor and a clamp diode in the parallel connection are employed in place of the pnp-type load transistor; moreover, the memory cells may be constituted with complementary MOS (CMOS) circuits. In addition, there can be implemented various embodiments including the concrete circuit configurations of the level generate circuits and the emitter follower circuits, the circuit block constitutions of the bipolar-type RAM of FIG. 2 and the RAM of the bipolar CMOS type of FIG. 5, and various possible combinations of the control signals and timing signals.

In the description above, the present invention has been described in conjunction with the cases in which the present invention is applied to the utilization field as the background of the present invention, namely, the bipolar-type RAM and the RAM of the bipolar CMOS type; however, the present invention is not restricted by the cases, for example, the present invention is also applicable to a programmable read only memory (ROM) of the bipolar type of which the peripheral circuits are constituted with ECL circuits and bipolar-CMOS composite circuits. The present invention can be broadly applied to a semiconductor memory device and a digital apparatus using such a semiconductor memory device at least including an ECL circuit and a plurality of constant voltage generate circuits which are selectively set to be effective according to the power source voltage supplied.

What is claimed is:

1. A semiconductor integrated circuit device comprising:
   a first level generate means and a second level generate means for respectively generating different reference levels;
   a first output means and a second output means linked to each other and each respectively supplied with one of the reference levels, wherein the first and second output means each respectively generate an output voltage corresponding to the reference level supplied thereto; and
   selective link means for linking either one of said first and second level generate means to said first and second output means.

2. A semiconductor integrated circuit device according to claim 1 further including input means wherein said input means comprises compare means for comparing one of said output voltages with an input signal supplied thereto.

3. A semiconductor integrated circuit device according to claim 2 wherein
   said first output means includes an emitter follower output circuit formed on one side of a semiconductor substrate and
   said second output means includes an emitter follower output circuit formed on the other side of the semiconductor substrate.

4. A semiconductor integrated circuit device according to claim 3 further including means coupled to said first and second output means for preventing the output voltage from a level fluctuation.

5. A semiconductor integrated circuit device according to claim 4 further comprising a memory circuit coupled to the first and second output means and including memory cells each having a pair of MOSFETs crosswise linked to each other.

6. A semiconductor integrated circuit device according to claim 1 wherein an output voltage of said first output means is coupled to provide a reference potential to an X-address buffer of a memory device, and further wherein an output voltage of said second output means is coupled to provide a reference potential to a Y-address buffer of a memory device.

7. A semiconductor integrated circuit device according to claim 1 wherein the semiconductor integrated circuit device includes a semiconductor memory, and wherein the first and second output means are coupled to predetermined elements of the semiconductor memory to provide reference signals thereto.

* * * * *